(12) United States Patent
Li et al.

(10) Patent No.: US 11,322,630 B2
(45) Date of Patent: May 3, 2022

(54) MONOLITHIC INFRARED TRANSCEIVER

(71) Applicant: Apple Inc., Cupertino, CA (US)

(72) Inventors: Weiping Li, Pleasanton, CA (US);
Arnaud Laflaquière, Paris (FR);
Chinhan Lin, Cupertino, CA (US); **Fei
Tan, Santa Clara, CA (US); Tong
Chen, Cupertino, CA (US); Xiaolong
Fang**, Fremont, CA (US)

(73) Assignee: APPLE INC., Cupertino, CA (US)

( * ) Notice: Subject to any disclaimer, the term of this patent is extended or adjusted under 35 U.S.C. 154(b) by 20 days.

(21) Appl. No.: 17/010,874

(22) Filed: Sep. 3, 2020

(65) Prior Publication Data

US 2021/0091244 A1    Mar. 25, 2021

Related U.S. Application Data

(60) Provisional application No. 62/903,968, filed on Sep. 23, 2019.

(51) Int. Cl.
*H01L 31/0352* (2006.01)
*H01L 31/0232* (2014.01)
*H01L 31/09* (2006.01)
*H01L 31/0304* (2006.01)

(52) U.S. Cl.
CPC ............ *H01L 31/035236* (2013.01); *H01L 31/02327* (2013.01); *H01L 31/03046* (2013.01); *H01L 31/09* (2013.01)

(58) Field of Classification Search
CPC ....... H01L 31/035236; H01L 31/02327; H01L 31/03046; H01L 31/09; H01L 31/03048; H01L 31/105; H01L 31/173; H01L 31/153; H01S 2301/173; H01S 5/0264; H01S 5/183; H01S 5/34306
See application file for complete search history.

(56) References Cited

U.S. PATENT DOCUMENTS 5,567,955 A * 10/1996 Liu .................. H01L 31/0352
257/21
5,753,928 A *  5/1998 Krause ............... H01L 31/173
250/551
5,780,867 A *  7/1998 Fritz .................... H01L 33/06
257/13

(Continued)

FOREIGN PATENT DOCUMENTS

CN        1585216 A  *  2/2005  ............ B82Y 20/00
CN      106531822 A  *  3/2017

OTHER PUBLICATIONS

Ng et al., "Long wavelength bulk GaInNAs p-i-n photodiodes lattice matched to GaAs", Journal of Applied Physics, vol. 101, issue 6, pp. 1-6, year 2007.

*Primary Examiner* — Sitaramarao S Yechuri
(74) *Attorney, Agent, or Firm* — Kligler & Associates Patent Attorneys Ltd

(57) ABSTRACT

An optoelectronic device includes a semiconductor substrate and a first stack of epitaxial layers, which are disposed over the semiconductor substrate and are configured to function as a photodetector, which emits a photocurrent in response to infrared radiation in a range of wavelengths greater than 940 nm. A second stack of epitaxial layers is disposed over the first stack and configured to function as an optical transmitter with an emission wavelength in the range of wavelengths greater than 940 nm.

17 Claims, 4 Drawing Sheets

(56) References Cited

U.S. PATENT DOCUMENTS

| | | | | |
|---|---|---|---|---|
| 6,028,323 | A * | 2/2000 | Liu | H01L 31/035236 257/21 |
| 10,411,146 | B1 * | 9/2019 | Ariyawansa | H01L 31/105 |
| 2005/0041714 | A1 * | 2/2005 | Kim | B82Y 20/00 372/50.21 |
| 2005/0083567 | A1 * | 4/2005 | Chun Liu | H01L 31/173 359/326 |
| 2014/0321700 | A1 * | 10/2014 | Zhan | H01L 25/50 382/103 |

* cited by examiner

MONOLITHIC INFRARED TRANSCEIVER

CROSS-REFERENCE TO RELATED APPLICATION

This application claims the benefit of U.S. Provisional Patent Application 62/903,968, filed Sep. 23, 2019, which is incorporated herein by reference.

FIELD OF THE INVENTION

The present invention relates generally to semiconductor devices, and particularly to optoelectronic devices and methods for their manufacture.

BACKGROUND

Monolithic infrared transceivers include both an infrared emitter, such as a vertical-cavity surface-emitting laser (VCSEL), and an infrared detector, such as a photodiode (PD), within the same stack of thin-film layers formed on a semiconductor substrate. Integrated transceivers of this sort are useful in a variety of applications.

SUMMARY

Embodiments of the present invention that are described hereinbelow provide improved optoelectronic transceivers and methods for their production.

There is therefore provided, in accordance with an embodiment of the invention, an optoelectronic device, including a semiconductor substrate and a first stack of epitaxial layers, which are disposed over the semiconductor substrate and are configured to function as a photodetector, which emits a photocurrent in response to infrared radiation in a range of wavelengths greater than 940 nm. A second stack of epitaxial layers are disposed over the first stack and are configured to function as an optical transmitter with an emission wavelength in the range of wavelengths greater than 940 nm.

In some embodiments, the photodetector includes a photodiode, and the first stack of the epitaxial layers includes a p-doped layer, an intrinsic absorption layer, and an n-doped layer. In a disclosed embodiment, the optical transmitter includes a vertical-cavity surface-emitting laser (VCSEL), including a lower distributed Bragg reflector (DBR), a quantum well layer disposed over the lower DBR, and an upper DBR disposed over the quantum well layer. In one embodiment, the lower DBR is disposed over the p-doped layer, the intrinsic absorption layer, and the n-doped layer of the photodiode.

Alternatively, the photodiode is interleaved within the lower DBR. In a disclosed embodiment, at least one of the epitaxial layers in the first stack serves as a part of the lower DBR.

In some embodiments, the semiconductor substrate includes GaAs. In one embodiment, at least the first stack of the epitaxial layers includes an absorbing layer of InGaAsN. The layer of InGaAsN typically includes $In_xGa_{1-x}As_yN_{1-y}$, having composition parameters x and y selected so as to match a lattice constant of the GaAs. Alternatively, at least the first stack of the epitaxial layers includes an absorbing layer of germanium.

In an alternative embodiment, the semiconductor substrate includes germanium, and at least the first stack of the epitaxial layers includes an absorbing layer of germanium.

In some embodiments, the second stack of the epitaxial layers includes a quantum-well layer including InGaAs. Alternatively, the second stack of the epitaxial layers includes a quantum-well layer including $In_xGa_{1-x}As_yN_{1-y}$, wherein the optical transmitter has an emission wavelength that is determined by the values of x and y.

In a disclosed embodiment, the emission wavelength of the optical transmitter is at least 1300 nm, and the photodetector emits the photocurrent in response to infrared radiation in a range of wavelengths greater than 1300 nm.

There is also provided, in accordance with an embodiment of the invention, a method for producing an optoelectronic device. The method includes depositing a first stack of epitaxial layers on a semiconductor substrate so as to form a photodetector, which emits a photocurrent in response to infrared radiation in a range of wavelengths greater than 940 nm. A second stack of epitaxial layers is deposited over the first stack so as to form an optical transmitter with an emission wavelength in the range of wavelengths greater than 940 nm.

The present invention will be more fully understood from the following detailed description of the embodiments thereof, taken together with the drawings in which:

DETAILED DESCRIPTION OF EMBODIMENTS

Overview

Figure 1:
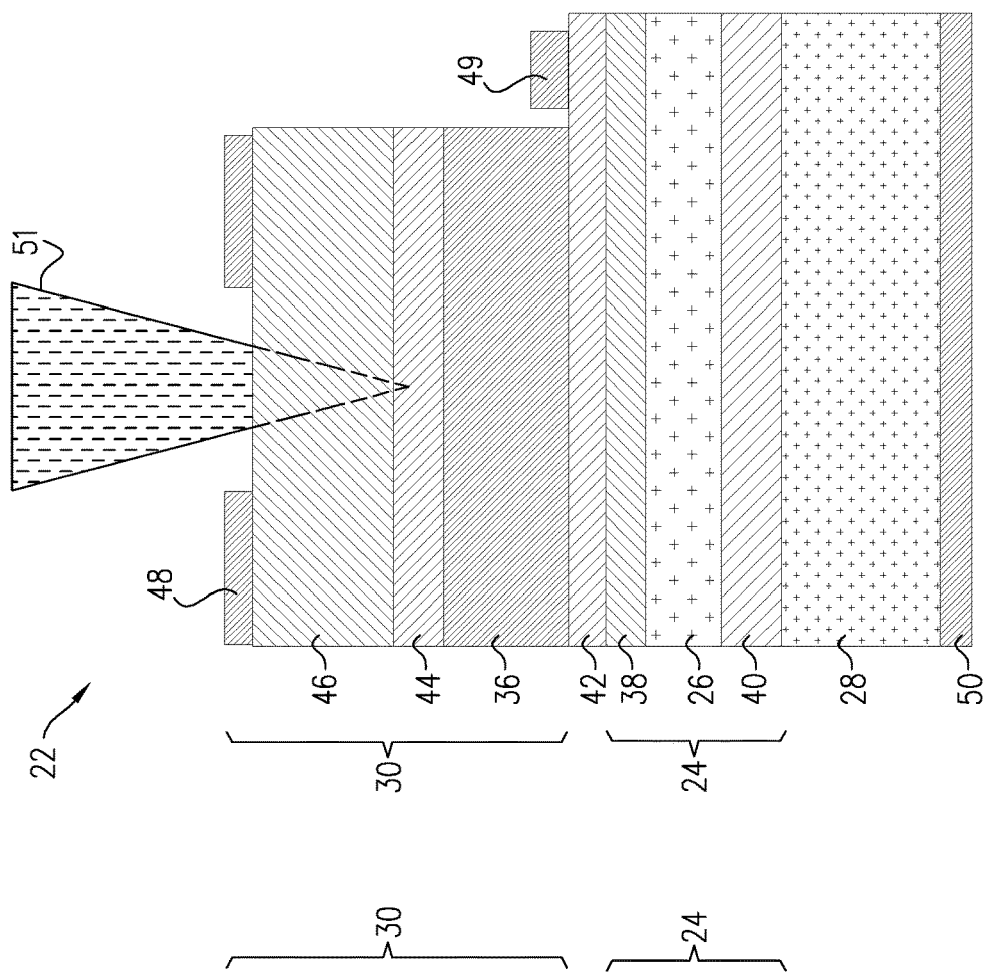
FIGS. 1 and 2 are schematic sectional views of optical transceivers, in accordance with embodiments of the invention.

Embodiments of the present invention that are described herein provide monolithic infrared transceivers in novel device architectures, which enable wafer-level integration of VCSELs and photodiodes with longer emission and detection wavelengths than in devices that are known in the art. These transceivers are capable of operating, for example, at wavelengths in the range of 940 nm-1300 nm, and even at wavelengths as long as 1500 nm. Specifically, the disclosed embodiments use a VCSEL with an InGaAs or InGaAsN quantum well (QW) layer for long-wavelength laser emission, over a compatible long-wavelength photodiode. In some embodiments, the photodiode comprises an InGaAsN absorption layer for long-wavelength detection, whereas other embodiments use a germanium (Ge) absorption layer.

In some embodiments, the photodiode measures the instantaneous emission intensity of the VCSEL and provides a feedback signal to a control circuit, thus enabling precise control of VCSEL output power and maintaining constant power operation of the VCSEL. This sort of wafer-level integration of the VCSEL and photodiode provides a monolithic and efficient solution for real-time monitoring of VCSEL power in applications using infrared wavelengths above 850 nm. When the photodetecting layer is buried within or below the bottom Distributed Bragg Reflector (DBR) of the VCSEL (as shown in the figures and described below), it provides a photocurrent that is linear in the VCSEL intra-cavity and output power, and enables measurement of the power with minimal loss and high immunity to ambient light. Real-time monitoring and closed-loop control of the VCSEL output is useful in ensuring compliance with power limitations and standards. Furthermore, stabilizing the VCSEL output power in this manner, over varying temperatures and device lifetime, facilitates applications involving intensity-based optical sensing, such as proximity sensing and biometric and health sensors.

In other embodiments, the photodiode is configured to measure the intra-cavity laser intensity, and specifically to sense modulation of this intra-cavity intensity due to the time of flight (ToF) of radiation emitted by the VCSEL and reflected back from a target. This sort of sensing can be used, for example, in proximity sensing, range mapping, and biological sensing applications. These latter embodiments are particularly useful in applications of coherent sensing, such as self-mixing interferometry and frequency-modulated continuous-wave (FMCW) LIDAR, in which the VCSEL works as a local oscillator for heterodyne detection. Other applications include direct and indirect ToF ranging and imaging.

Monolithic transceivers comprising a VCSEL and photodiode that operate at infrared wavelengths in the range beyond 850 nm have a number of advantages over conventional, shorter-wavelength devices. The longer radiation wavelengths are less visible and safer to the eye. By appropriately setting the concentrations of indium (In) and possibly nitrogen (N) in the GaAs lattice, as explained below, it is possible to select an optimal emission and detection wavelength for the application of interest. The wavelength may be selected based, inter alia, on the target and background signals in the application environment. In single-mode operation, the longer wavelength is also advantageous in giving a larger aperture size. Other potential benefits of longer wavelength include better skin depth penetration in biosensing applications; wavelength selection to optimize reflection and/or absorption by the target, as well as differential sensing at multiple wavelengths; and reduced disturbance when the transceiver is deployed behind a display panel.

It is known in the art that addition of indium to a GaAs bulk layer shifts the absorption and emission bands of the layer to longer wavelengths. InGaAs has a larger lattice constant than GaAs, however, leading to a lattice mismatch between the InGaAs and the underlying GaAs. This mismatch increases with indium concentration and can cause substantial lattice strain and deterioration of the quality of the overlying VCSEL epitaxial layers. For this reason, monolithic integration of long-wavelength emitters and detectors on a GaAs substrate, using a GaAs bulk layer as the light absorption layer in the photodiode, has been limited to wavelengths of roughly 850 nm.

The embodiments of the present invention that are described hereinbelow overcome this limitation by modifying the absorption layer of the photodiode, with appropriate adjustment of the layer composition to achieve good lattice matching. In some embodiments, both indium (In) and nitrogen (N) are added to the GaAs in the absorption layer. This combination significantly reduces the bandgap, thus extending the detection wavelength of the InGaAsN photodiode into the range beyond 1000 nm, and even as far as 1300-1500 nm. At the same time, appropriate choice of the concentrations of In and N enable the lattice constant of the InGaAsN to be matched to that of GaAs. Thus, InGaAsN layers can be grown on the GaAs substrate with little or no lattice strain. Moreover, high-quality long-wavelength GaAs-based VCSELs with an InGaAs or InGaAsN QW layer can be grown on the monolithic structure on top of the lattice-matched InGaAsN photodiode structure, providing laser light with wavelength extended beyond 850 nm to as much as about 1300 nm.

Other embodiments of the present invention use a germanium (Ge) absorption layer in the photodiode, over a Ge or GaAs wafer substrate. Germanium has advantages of long wavelength absorption, with high quantum efficiency out to wavelengths of about 1.6 µm. It also has a lattice constant that is well matched to GaAs and to compounds containing Ga and As. Embodiments in which the photodiode and VCSEL layers are grown over a germanium substrate have the further advantage that germanium wafers offer greater strength and material quality than GaAs wafers and are available in larger wafer sizes and at lower cost than GaAs, thus offering higher yield and lower cost in mass production.

Transceivers Using InGaAsN Photodiodes

Figure 2:
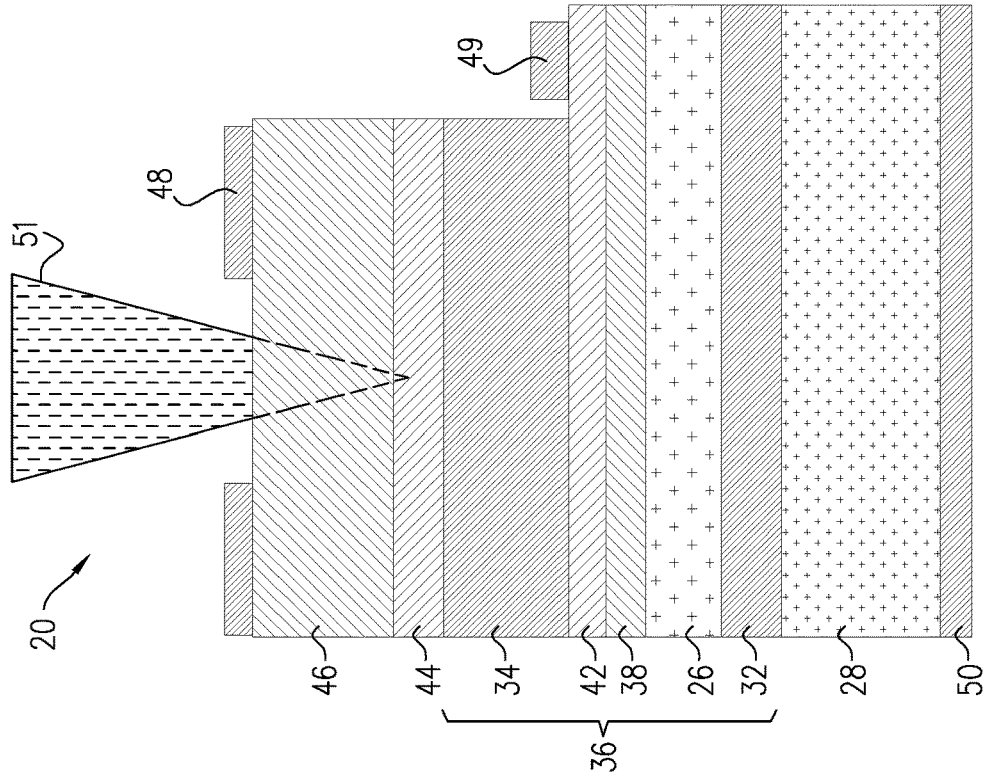

FIGS. 1 and 2 are schematic sectional views of optical transceivers 20 and 22, respectively, showing two possible embodiments of the present invention. In both of these embodiments, a set of epitaxial layers defining a PIN photodiode 24, including an intrinsic InGaAsN layer 26, is deposited on a GaAs substrate 28. Another set of layers defining a VCSEL 30 is then deposited over the photodiode. In transceiver 20, the lattice-matched InGaAsN PIN photodiode 24 is interleaved between lower layers 32 and upper layers 34 of a lower distributed Bragg reflector (DBR) 36 of VCSEL 30 and is thus integrated with the laser cavity. In transceiver 22, on the other hand, lower DBR 36 is deposited entirely over PIN photodiode 24, which is thus positioned outside the laser cavity.

In the pictured embodiments, GaAs substrate 28 and lower DBR 36 are n-doped (although alternatively, the substrate and/or lower DBR could be p-doped). In transceiver 20, PIN photodiode 24 comprises n-doped lower layers 32 of the lower DBR, intrinsic InGaAsN layer 26, and an upper p-GaAs layer 38. In other words, n-doped layers 32 in the stack of photodiode 24 also serve as a part of lower DBR 36. In transceiver 22, PIN photodiode 24 comprises an n-GaAs layer 40, intrinsic InGaAsN layer 26, and upper p-GaAs layer 38. In both embodiments, an n-GaAs contact layer 42 is deposited over upper p-GaAs layer 38.

A quantum well (QW) layer 44 of VCSEL 30 is deposited over lower DBR 36. Layer 44 comprises, for example, InGaAs or InGaAsN, with the proportions between the component elements selected based on the desired laser wavelength. An upper, p-doped DBR 46 is deposited over QW layer 33. After deposition of the epitaxial layers of photodiode 24 and VCSEL 30, the layers are etched to define the mesa of each transceiver 20, 22.

As noted earlier, the proportions of the elements in intrinsic InGaAsN layer 26 can also be adjusted to achieve the desired detection wavelength for PIN photodiode 24 while preserving good lattice matching with GaAs substrate 28. In one embodiment (not shown explicitly in the figures), the intrinsic absorption layer in photodiode 24 comprises multiple sub-layers, such as latticed-matched or strain-compensated layers of $In_xGa_{(1-x)}As^{(1-y)}Ny$ and $In_aGa_{(1-a)}As_{(1-b)}N_b$ in a quantum-well structure or superlattice structure, wherein x, y, a and b represent different compositions of In and N in the (In)GaAs(N) material.

Electrodes are deposited onto the mesas of transceivers 20 and 22 in order to enable actuation of and readout from the transceiver. These electrodes include a VCSEL anode 48 and a VCSEL cathode 49, which also serves as the anode for photodiode 24. A cathode 50 for photodiode 24 can be deposited on the lower side of substrate 28. When an appropriate excitation voltage is applied between anode 48 and cathode 49, VCSEL 30 emits a beam 51 of infrared radiation. The signals output by photodiodes 24 between electrodes 49 and 50 can be used in monitoring and controlling the intensity of beam 51, as well as in coherent sensing of radiation from beam 51 that is reflected from a target back to the transceiver.

Figure 3:
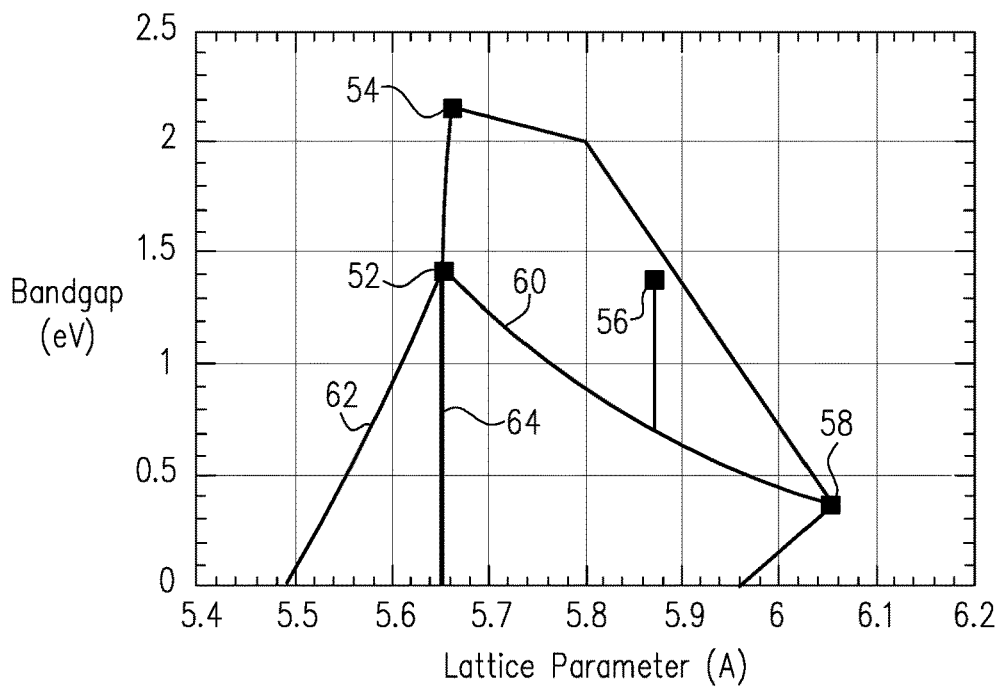
FIGS. 3 and 4 are plots that schematically illustrate physical principles implemented in the embodiments of FIGS. 1 and 2.
Figure 4:
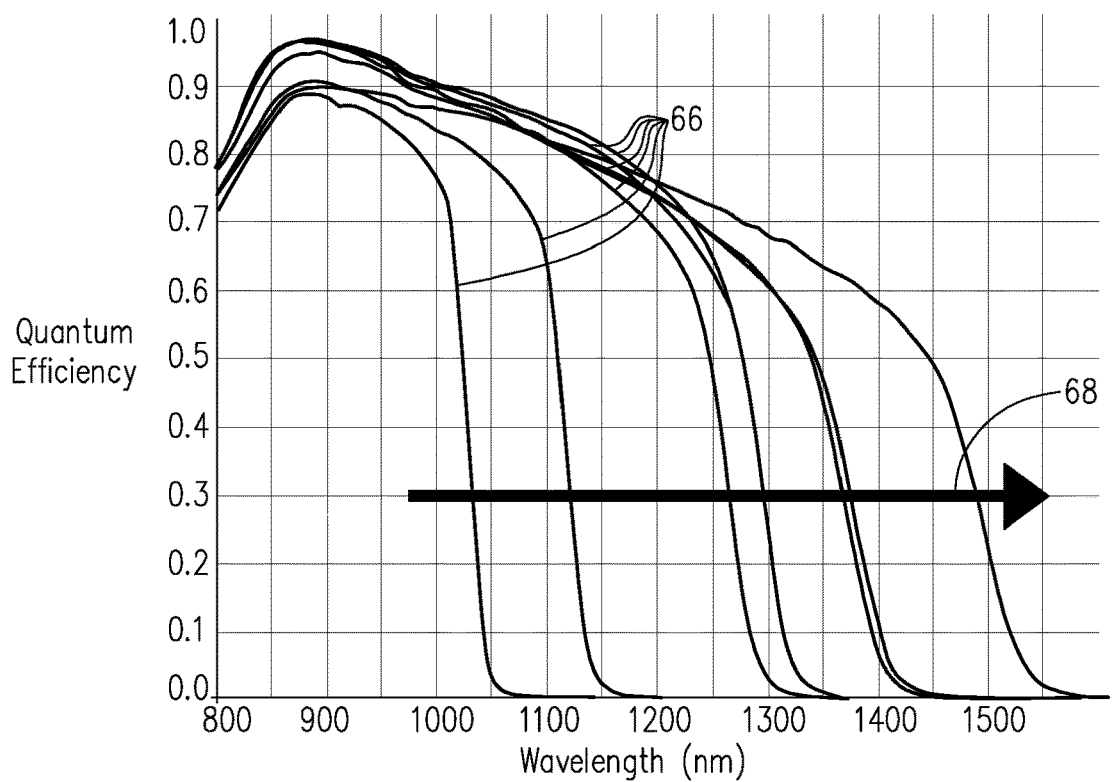

FIGS. 3 and 4 are plots that illustrate the physical principles implemented in the embodiments of FIGS. 1 and 2. These figures are based on information presented by Ng et al., in "Long wavelength bulk GaInNAs p-i-n photodiodes lattice matched to GaAs," *Journal of Applied Physics* 101, 064506 (2007). FIG. 3 shows the dependence of the crystal lattice parameter and bandgap on crystal composition for various semiconductor compounds that include Ga, As, In and N. FIG. 4 shows the quantum efficiency of crystal absorption of $Ga_xIn_{1-x}As_yN_{1-y}$ as a function of wavelength, with each curve 66 corresponding to a different pair of values (x,y), and an arrow 68 indicating the effect of increasing indium and nitrogen concentration (i.e., decreasing x and y).

As illustrated in FIG. 4, in intrinsic InGaAsN layer 26 of photodiode 24 and in QW layer 44 of VCSEL 30, the bandgap decreases as the parameters x and y in the $Ga_xIn_{1-x}As_yN_{1-y}$ decrease. Thus, increasing the concentrations of In and N in layers 26 and 44 extends the infrared wavelength range for emission and detection, reaching out as far as 1500 nm, as shown in FIG. 4.

In the graph plotted in FIG. 3, nodes 52, 54, 56 and correspond respectively to the bandgaps and lattice parameters of GaAs, AlAs, InP and InAs. An edge 60 shows the effect of increasing In concentration, which increases the lattice parameter, whereas increasing N concentration decreases the lattice parameter, as shown by an edge 62. By appropriate selection of the values of x and y in $Ga_xIn_{1-x}As_yN_{1-y}$, these opposing lattice effects can be made to cancel out, as illustrated by a vertical edge 64 at about 5.65 Å in FIG. 3. Thus, x and y can be set in fabrication of layers 26 and 44 so as to prevent lattice mismatch while enabling long-wavelength operation out to the desired cutoff.

Transceivers Using Germanium Photodiodes

Figure 6:
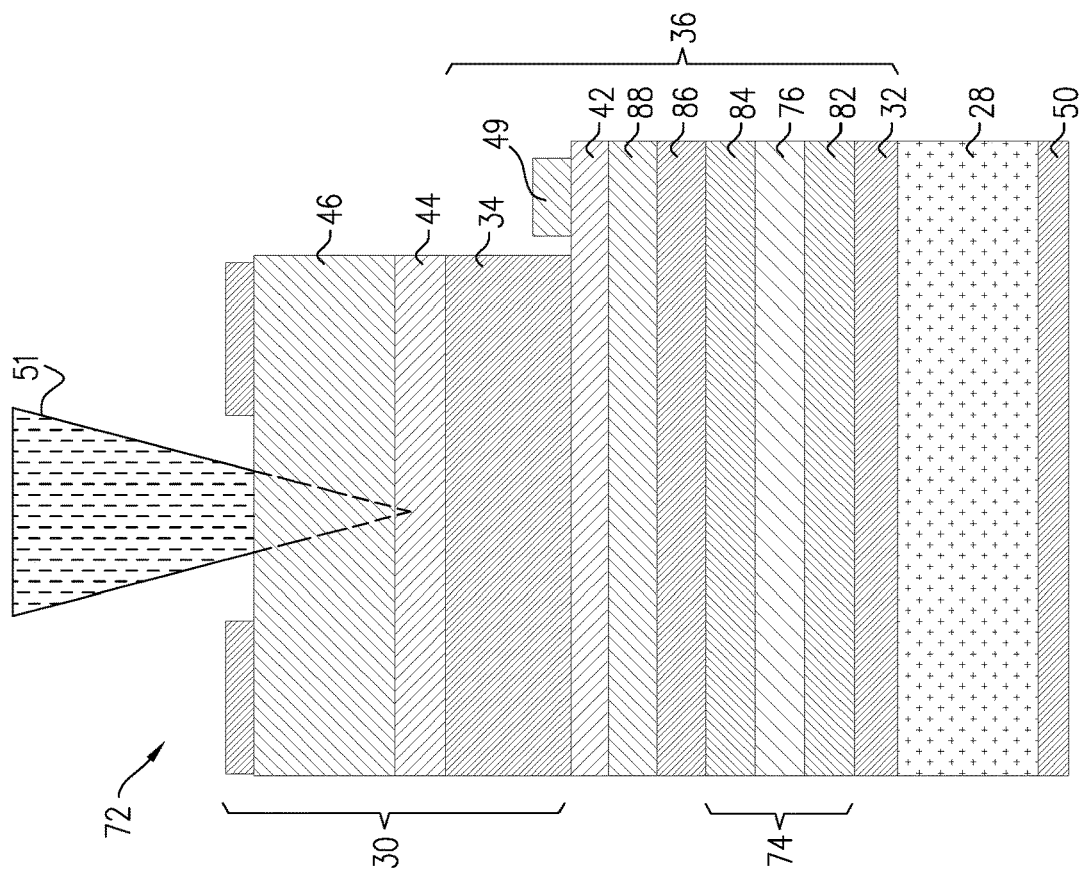
FIGS. 5 and 6 are schematic sectional views of optical transceivers, in accordance with further embodiments of the invention.
Figure 5:
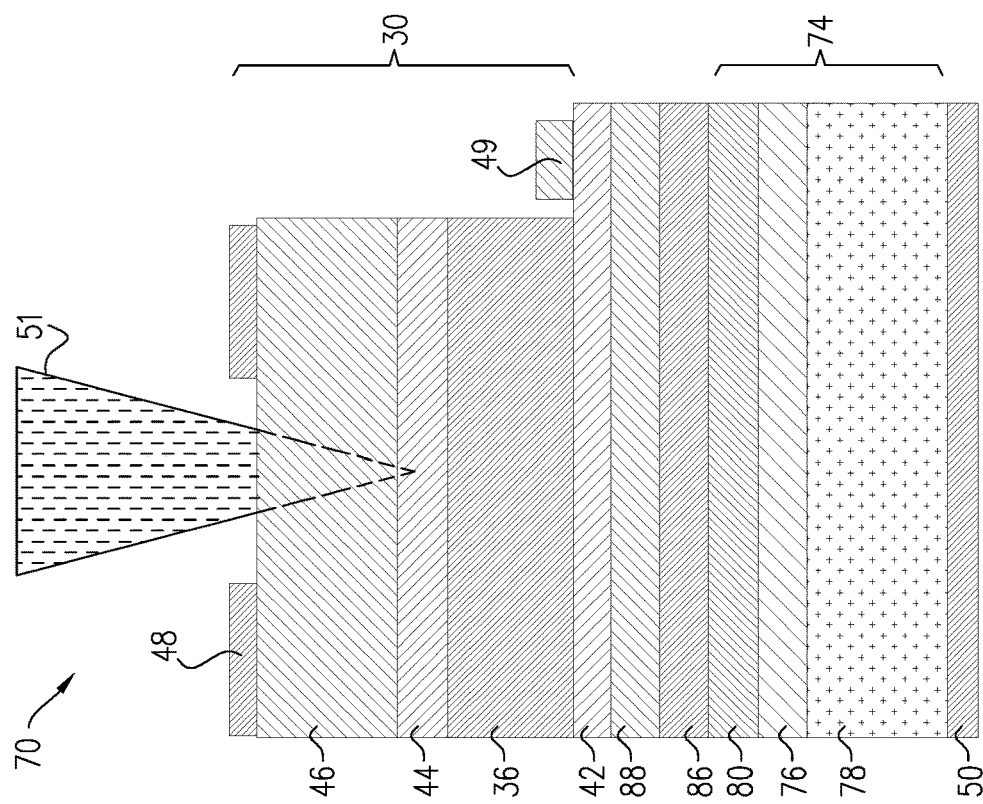

FIGS. 5 and 6 are schematic sectional views of optical transceivers 70 and 72, respectively, showing two further embodiments of the present invention. These embodiments are similar in their general principles to transceivers 20 and 22, as shown and described above; and certain components in transceivers 70 and 72 are labeled with the same indicator numbers as their counterparts in the preceding embodiments. In place of the InGaAsN-based photodiodes in transceivers 20 and 22, however, transceivers 70 and 72 comprise respective sets of epitaxial layers defining a PIN photodiode 74 comprising an intrinsic germanium (Ge) layer 76.

In transceiver 70 (FIG. 5), intrinsic Ge layer 76 is deposited on a p-doped Ge substrate 78, such as a suitable germanium wafer. An n-doped Ge layer 80 is deposited over layer 76 to complete the PIN structure of photodiode 74. Another set of layers defining VCSEL 30, as in the preceding embodiments, is deposited over photodiode 74. To facilitate lattice matching between the Ge-based lattice of the photodiode and the GaAs-based lattice of the VCSEL, a GaAs nucleation layer 86 is deposited over n-doped Ge layer 80, followed by an n-doped buffer layer 88 of GaAs or GaInAs. An n-GaAs contact layer 42 is deposited over buffer layer 88, followed by lower DBR 36, QW layer 44 comprising InGaAs or InGaAsN, and upper DBR 46, as in the embodiment of FIG. 2.

Transceiver 72 (FIG. 6), on the other hand, is grown on GaAs substrate 28, which is n-doped. In this embodiment, PIN photodiode 74 interleaved between lower layers 32 and upper layers 34 of lower DBR 36 of VCSEL 30, as in the embodiment of FIG. 1. In this case, however, photodiode 74 comprises an n-doped Ge layer 82, which is deposited over the n-doped GaAs of lower DBR layers 32. Intrinsic Ge layer 76 is deposited over n-doped Ge layer 82, followed by a p-doped Ge layer 84 to complete the PIN structure. Nucleation layer 86 and n-doped buffer layer 88 are deposited over the layers of photodiode 74, followed by the remaining layers of VCSEL 30.

Figure 7:
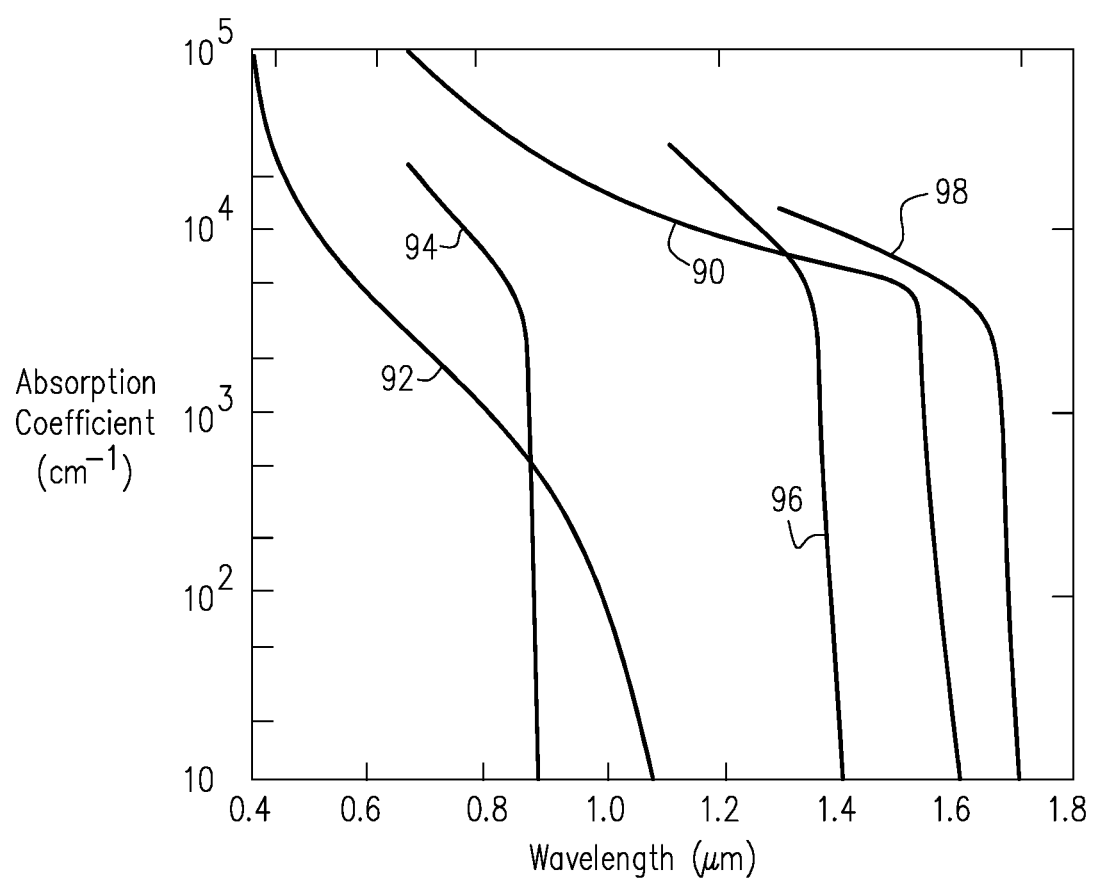
FIG. 7 is a plot that schematically illustrates physical principles implemented in the embodiments of FIGS. 5 and 6.

FIG. 7 is a plot that illustrates the physical principles implemented in the embodiments of FIGS. 5 and 6. FIG. 7 shows the absorption coefficients of a number of semiconductor materials that can be used in photodiode 74 as a function of wavelength. Absorption behavior of germanium is illustrated by a curve 90, which shows that intrinsic Ge layer 76 will absorb light strongly throughout the near infrared range, out to a band edge at a wavelength of about 1.6 μm. Curves 92 and 94 show the absorption limits of silicon and GaAs, respectively, which are ineffective beyond 1 μm. Curves 96 and 98 show the absorption behavior of certain compositions of InGaAsP and InGaAs, respectively. These latter compounds exhibit strong absorption at longer infrared wavelengths, but their lattice constants are mismatched to that of GaAs, as illustrated in FIG. 3.

In contrast to InGaAsP and InGaAs, germanium has a lattice constant of 5.646 Å, which is well matched to the lattice constant of GaAs (5.65 Å, as mentioned above), as well as to AlGaAs (which may be used in DBR 36, for example). Thus, the use of germanium in photodiode 74 is advantageous in both achieving efficient absorption over a wide wavelength range and in reducing stress and bowing in the epitaxial layers of transceivers 70 and 72.

It will be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:

1. An optoelectronic device, comprising:
   a semiconductor substrate;
   a first stack of epitaxial layers, comprising a p-doped layer, an intrinsic absorption layer, and an n-doped layer, which are disposed over the semiconductor substrate and are configured to function as a photodiode, which emits a photocurrent in response to infrared radiation in a range of wavelengths greater than 940 nm; and
   a second stack of epitaxial layers, which are disposed over the first stack and are configured to function as a vertical-cavity surface-emitting laser (VCSEL), comprising a lower distributed Bragg reflector (DBR), a quantum well layer disposed over the lower DBR, and an upper DBR disposed over the quantum well layer, with an emission wavelength in the range of wavelengths greater than 940 nm,
wherein the photodiode is interleaved within the lower DBR.

2. The device according to claim 1, wherein at least one of the epitaxial layers in the first stack serves as a part of the lower DBR.

3. The device according to claim 1, wherein the semiconductor substrate comprises GaAs.

4. The device according to claim 3, wherein at least the first stack of the epitaxial layers comprises an absorbing layer of InGaAsN.

5. The device according to claim 4, wherein the layer of InGaAsN comprises $In_xGa_{1-x}As_yN_{1-y}$, having composition parameters x and y selected so as to match a lattice constant of the GaAs.

6. The device according to claim 1, wherein the semiconductor substrate comprises germanium, and at least the first stack of the epitaxial layers comprises an absorbing layer of germanium.

7. The device according to claim 1, wherein the second stack of the epitaxial layers comprises a quantum-well layer comprising InGaAs.

8. The device according to claim 1, wherein the second stack of the epitaxial layers comprises a quantum-well layer comprising $In_xGa_{1-x}As_yN_{1-y}$, wherein the emission wavelength of the optical transmitter is determined by respective values of x and y.

9. The device according to claim 1, wherein the emission wavelength of the optical transmitter is at least 1300 nm, and the photodetector emits the photocurrent in response to infrared radiation in a range of wavelengths greater than 1300 nm.

10. An optoelectronic device, comprising:
a semiconductor substrate comprising GaAs;
a first stack of epitaxial layers, which are disposed over the semiconductor substrate and are configured to function as a photodetector, which emits a photocurrent in response to infrared radiation in a range of wavelengths greater than 940 nm; and
a second stack of epitaxial layers, which are disposed over the first stack and are configured to function as an optical transmitter with an emission wavelength in the range of wavelengths greater than 940 nm,
wherein at least the first stack of the epitaxial layers comprises an absorbing layer of germanium.

11. The device according to claim 10, wherein the photodetector comprises a photodiode, and the first stack of the epitaxial layers comprises a p-doped layer, an intrinsic absorption layer, and an n-doped layer.

12. The device according to claim 11, wherein the optical transmitter comprises a vertical-cavity surface-emitting laser (VCSEL), comprising a lower distributed Bragg reflector (DBR), a quantum well layer disposed over the lower DBR, and an upper DBR disposed over the quantum well layer.

13. The device according to claim 12, wherein the lower DBR is disposed over the p-doped layer, the intrinsic absorption layer, and the n-doped layer of the photodiode.

14. A method for producing an optoelectronic device, the method comprising:
depositing a first stack of epitaxial layers, comprising a p-doped layer, an intrinsic absorption layer, and an n-doped layer, on a semiconductor substrate so as to form a photodiode, which emits a photocurrent in response to infrared radiation in a range of wavelengths greater than 940 nm; and
depositing a second stack of epitaxial layers over the first stack so as to form a vertical-cavity surface-emitting laser (VCSEL), comprising a lower distributed Bragg reflector (DBR), a quantum well layer disposed over the lower DBR, and an upper DBR disposed over the quantum well layer, with an emission wavelength in the range of wavelengths greater than 940 nm,
wherein the photodiode is interleaved within the lower DBR.

15. The method according to claim 14, wherein the semiconductor substrate comprises GaAs, and wherein at least the first stack of the epitaxial layers comprises an absorbing layer of InGaAsN.

16. The method according to claim 15, wherein the layer of InGaAsN comprises $In_xGa_{1-x}As_yN_{1-y}$, having composition parameters x and y selected so as to match a lattice constant of the GaAs.

17. The method according to claim 14, wherein depositing the first stack of the epitaxial layers comprises forming an absorbing layer of intrinsic germanium.

* * * * *